United States Patent [19]

Hilden et al.

[11] Patent Number: 5,257,270

[45] Date of Patent: Oct. 26, 1993

[54] SHIFT-CORRECTION CODE RATE-ENHANCING PARITY ENCODING/DECODING

[75] Inventors: Hugh M. Hilden, Honolulu, Hi.; Dennis G. Howe, Pittsford, N.Y.; Edward J. Weldon, Jr., Honolulu, Hi.

[73] Assignee: Eastman Kodak Company, Rochester, N.Y.

[21] Appl. No.: 633,879

[22] Filed: Dec. 26, 1990

[51] Int. Cl.$^5$ .................. H03M 13/00; H03M 7/46
[52] U.S. Cl. .................. 371/37.1; 341/59
[58] Field of Search .................. 371/37.1, 40.1; 341/59

[56] References Cited

PUBLICATIONS

Bliss, W., "Circuitry for Performing Error Correction Calculations or Baseband Encoded Data to Eliminate Error Propagation", *IBM Tech. Discl. Bull.*, vol. 23, No. 10, Mar. 1981, pp. 4633–4634.

Schneider, H., "Disk System ICs Combat Data Errors", *Computer Design*, Mar. 1985, pp. 147–152.

*Primary Examiner*—Stephen M. Baker
*Attorney, Agent, or Firm*—William W. Holloway

[57] ABSTRACT

A method for coding/decoding ternary symbols to d,k-constrained binary runs in a way that (i) associates (codes) a number of ternary symbols with a lesser number of d,k-constrained binary runs and (ii) provides that an individual single-shift error in any of the received binary runs that constitute a binary data codeword will cause at most one ternary symbol to be in error in the associated (decoded) ternary symbol codeword. This method allows shift-correction codeword parity checks to be transmitted (i.e., transformed to a d,k-constrained channel data sequence) with increased efficiency, so that the required number of channel bits needed to represent the parity checks is decreased.

18 Claims, 7 Drawing Sheets

SCC ENCODER

SCC DECODER

SHIFT-CORRECTION CODE RATE-ENHANCING PARITY ENCODING/DECODING

CROSS-REFERENCE TO RELATED APPLICATIONS

This application contains subject matter related to U.S. application Ser. No. 07/433,877 filed Nov. 9, 1989 by Dennis G. Howe et al. and entitled: SHIFT CORRECTING CODE FOR CHANNEL ENCODED DATA, which is a continuation of U.S. application Ser. No. 07/200,166 now abandoned filed May 31, 1988 by the same inventors with the same assignee as the present application.

BACKGROUND OF THE INVENTION

1. Technical Field

The invention is related to error correction systems and in particular to shift-error correction systems for channel-encoded data.

2. Background Art

Shift-correction codes (described in the above-referenced commonly assigned U.S. patent application) based on ternary block codes may be used to protect run-length-limited (RLL) binary data (channel data) against certain types of errors. During the encoding operation, the shift-error correction encoder will (i) represent a block of input (information) d,k-constrained channel data as a sequence of ternary symbols (or "trits"), (ii) calculate a (usually much shorter) sequence of parity trits which uniquely correspond to the information trit sequence, (iii) map (code) the parity trit sequence to a d,k-constrained binary sequence (i.e., transform the parity checks to channel data) that is appended to the original block of information channel data to form a channel data representation of a shift-correction codeword, and (iv) transmit such encoded data. One useful aspect of shift-correction coding of channel data (relative to coding on user data prior to modulating it to channel data) is that the rate of the channel data representation of a shift-correction code is somewhat higher than the rate of the ternary code on which the shift-correction code is based. This is due to the fact that, on average, the number of information channel bits represented by each information trit is larger than the number of channel bits needed to represent a parity trit. This illustrated by the following example:

In a maxentropic 2,7-constrained binary code there are, on average, 4.53 channel bits in each "run" (a run is comprised of a channel data "one" together with the number of contiguous channel data "zeros" that immediately follow it), while in a widely used (practical) 2,7 code there are an average of 4.42 channel bits per run. Since each shift-correction code information trit represents one information channel run, a codeword of a shift-correction code that is based on a (N,K) ternary block error correcting code will have an average of 4.42K channel bits in its information part (when the practical 2,7 modulation code is used). On the other hand, since each parity trit has only one of the three possible values, it is represented by one of the three shortest possible channel runs (which have lengths 3, 4, or 5 channel bits in the 2,7 modulation code of this example). Since each of the three possible parity trit values occur with equal probability, the average length of a parity channel run is four channel bits. Therefore, the rate of the channel data representation of the shift-correction codeword (based on the (N,K) ternary code) is $$R_{scc} = 4.42K/(4.42K + 4(N-K)) \qquad (1)$$

while the rate of the base code is $$R_B = K/N. \qquad (2)$$

The shift-correction code thus enjoys a rate advantage of $$\Delta R = R_{scc}/R_B = 4.42/(4 + 0.42R_B) > 1 \qquad (3)$$

so that, in our example, rate increases exceeding 5% are possible, depending on $R_B$.

The rate increase $\Delta R$ can be enhanced (made larger) if the overall number of channel bits needed to represent the shift-correction code's parity trits can be reduced further. One method of accomplishing this is to reduce the number of parity channel data runs that are required, i.e., to map (code) more than one parity trit per channel run. Doing this, however, is complicated by the fact that error multiplication must be avoided when received channel data is decoded back to parity trits, i.e., our mapping must be such that if any received channel data sequence suffers t shift-errors (a shift-error changes the decimal value of a run by $\pm 1$) the sequence of trits obtained via decoding of the erroneous channel data will contain at most t incorrect trits. A trit to d,k-constrained binary code that obeys this last condition is said to obey the "shift-error condition". We note that the trit to d,k-constrained binary mapping used in the parent application obeys the shift-error condition, but it maps each parity trit to a single channel run. If the shift-error condition is not obeyed, a channel data shift-error will cause more than one shift-correction code symbol (i.e., trit) to be erroneous and the shift-correction code's performance (i.e., its shift-error correcting capability) will be seriously degraded.

DISCLOSURE OF THE INVENTION

We shall first describe a shift-error condition compliant method of coding/decoding two trits (i.e., a "trit pair") per run of d,k-constrained binary data. The encoding scheme is based on (i) grey coding pairs of trits and (ii) assigning each grey-coded trit pair to a single unique channel run. This is illustrated in Table I, which has the grey-coded trit pairs listed in its first column and numerals $R_0, R_1, R_2, \ldots, R_8$ to which those trit pairs are mapped in its third column. Each of the numbers $R_j$ is associated via a technique taught in the above-referenced commonly assigned application with a unique run of channel data that is transmitted. (This technique of transforming the $R_j$ to channel data runs will be reviewed in the detailed description of the invention which follows.) This latter transformation (i.e., the transformation of $R_j$ to a unique channel data run) provides that a shift-error which occurs in the channel data associated with some sequence of the $R_j$ will alter the value by $\pm 1$ of only one of the $R_j$ recovered via the inverse of the transformation.

More specifically, if the sequence of channel data that represents a sequence ($R_j$) suffers shift-errors, each shift-error can change only one of the recovered $R_j$ values to either of the nearest values $R_{j-1}$ or $R_{j+1}$ (we note that the $R_j$ are cyclic with respect to this, i.e., a shift-error that effects $R_0$ may change it to either $R_8$ or $R_1$ and similarly $R_8$ may become $R_7$ or $R_0$.) Thus, from Table I we can see that when a sequence of numerals $R_j$ which is corrupted by one shift-error is decoded back to the sequence of parity trit pairs, the resulting trit sequence will have only one erroneous trit, i.e., the shift-error condition is obeyed.

In order to practice this method of coding/decoding two trits per run, the d,k-constrained channel code must provide at least nine unique runs, i.e., it must have $(k-d) \geq 8$. Thus for example this method could be used with 2,10 or 3,11 RLL channel codes, but not with 1,7 or 2,7 RLL channel codes.

The rate of a shift-correction code that is based on an (N,K) block ternary code, when using the referenced application's method of coding parity trits to channel data (one trit per run of average length $d+2$) is given by $$R_{scc} = \frac{K \bar{L}_1}{K \bar{L}_1 + (N - K)(d + 2)} \quad (4)$$

where $\bar{L}_1$ = average number of channel bits per run for the d,k-constrained channel code used, N = total number of symbols (trits) per (N,K) base code codeword, K = number of information symbols (trits) per (N,K) base code codeword.

Using the trit pair to RLL binary code described in Table I to map parity trits to channel data, this same shift-correction code would have rate (here a pair of parity trits is mapped to one of nine runs having average length $d+5$ channel bits)

$$R'_{scc} = \frac{K \bar{L}_1}{K \bar{L}_1 + (N - K)(d + 5)/2} \quad (5)$$

Thus, practicing the invention results in a shift-correction code rate enhancement (increase) of $$\Delta R' = R'_{scc}/R_{scc} = \frac{1 + (N - K/K)(d + 2)/\bar{L}_1}{1 + (N - K/K)(d + 5)/2\bar{L}_1} \quad (6)$$

which, for example, when $d = 2$ and $\bar{L}_1 = 4.64$ (as would occur for an efficient 2,10 RLL code) has value $\Delta R' > 1.06$ as $(N-K)/K$ approaches 1. Thus, if 2,10 RLL modulation code (or any $d = 2$ RLL code having $(k-d) \geq 8$) is used, shift-correction code rate increases of 6 percent or more are possible via the invention. Even larger rate increases are achievable when RLL modulation codes with $d > 2$ are used.

We shall now consider a shift-error condition compliant method of coding/decoding three trits per two runs of d,k-constrained binary data. This method will be useful with d,k-constrained channel data that has only six unique run lengths, i.e., when $(k-d) \geq 5$ (thus, this method can be used with both 1,7 and 2,7 RLL modulation codes). The method consists of (i) grey coding triples of trits and (ii) assigning each such grey coded trit triple to a unique pair of d,k-constrained channel data runs. This process is illustrated in Table IV, where the twenty-seven possible trit triples are laid out as a two dimensional matrix (ignore, for the moment, the nine triples contained in the boxes at the intersections of rows 2, 4, 6 and columns 2, 4, 6 of Table IV). The first and second of the pair of run numerals $P_j$, $S_k$ ($j = 0, 1, \ldots, 5$ and $k = 0, 1, \ldots, 5$) to which the triples are assigned are listed at the left of each matrix row and at the head of each matrix column respectively. Coding is done by locating the input trit triple in the matrix and assigning to it the $P_j$, $S_k$ values that identify the row/column location of the input triple in the Table IV matrix. The sequence of numeral pairs $\{P_j, S_k\}$ which is obtained from the input sequence of trits is then transformed to a sequence of run pairs via the technique taught in the above-referenced application. This process provides that a shift-error that occurs in the channel data associated with the numeral pair sequence $\{P_j, S_k\}$ will alter by $\pm 1$ only one of the $P_j$ or $S_k$ that are recovered via the inverse of the process (both the $P_j$ and $S_k$ are cyclic with respect to such alterations).

Inspection of Table IV shows that if the value of one of the received pair of run numerals is cyclically shifted (i.e., its value is changed to that of either of its cyclic neighbors), the decoded trit triple will be erroneous in only one of its three elements. This is true even if one of the run numeral pairs not used by the encoder (e.g., $P_1$, $S_1$) is received, provided that we decode such illegal received run numeral pairs into the trit triples shown at the corresponding locations (the trit triples contained in the small boxes) in Table IV. Thus, this trit triple to RLL run pair coding/decoding process obeys the shift-error condition.

Since all twenty-seven possible parity trit triples occur with equal probability, the rate of this trit triple to run pair code can be shown to be 3 trits per $2(d+3.333)$ channel bits; the average rate of an (N,K) block code based shift-correction coder that uses this method of mapping parity trits to d,k-constrained channel data is $$R''_{scc} = \frac{K \bar{L}_1}{K \bar{L}_1 + (N - K)2(d + 3.333)/3} \quad (7)$$

Finally, if the (N,K) base code on which the shift-correction code is based has a number of parity checks that is not divisible by two (in the case when $(k-d) \geq 8$), or three (in the case when $8 > (k-d) \geq 5$), we must input one (or two) additional "dummy" or "padding" trits into the trit pair to single run encoder (or into the trit triple to run pair encoder) to cause a complete decodable codeword to be produced. Highest code rate can be achieved by computing the padding trit values to be such that the shortest possible last run (or run pair) is produced by the encoder.

BRIEF DESCRIPTION OF THE DRAWINGS

The invention is described below in detail by reference to the accompanying drawings, of which.

MODES FOR CARRYING OUT THE INVENTION

We shall illustrate the use of trit pair to single run encoding/decoding to encode/decode the parity checks of a shift-correcting modulation code that is based on a shortened m=3 ternary BCH error correcting code (we assume use of a d=2 RLL modulation code that obeys (k−d) ≧8). First, however, to augment the clarity of the illustration we shall review the shift-correction coding/decoding method taught in the above-referenced commonly assigned patent application. The various tables referred to hereinafter are given at the conclusion of the specification.

Review of Shift Correction Coding/Decoding

Figure 1:
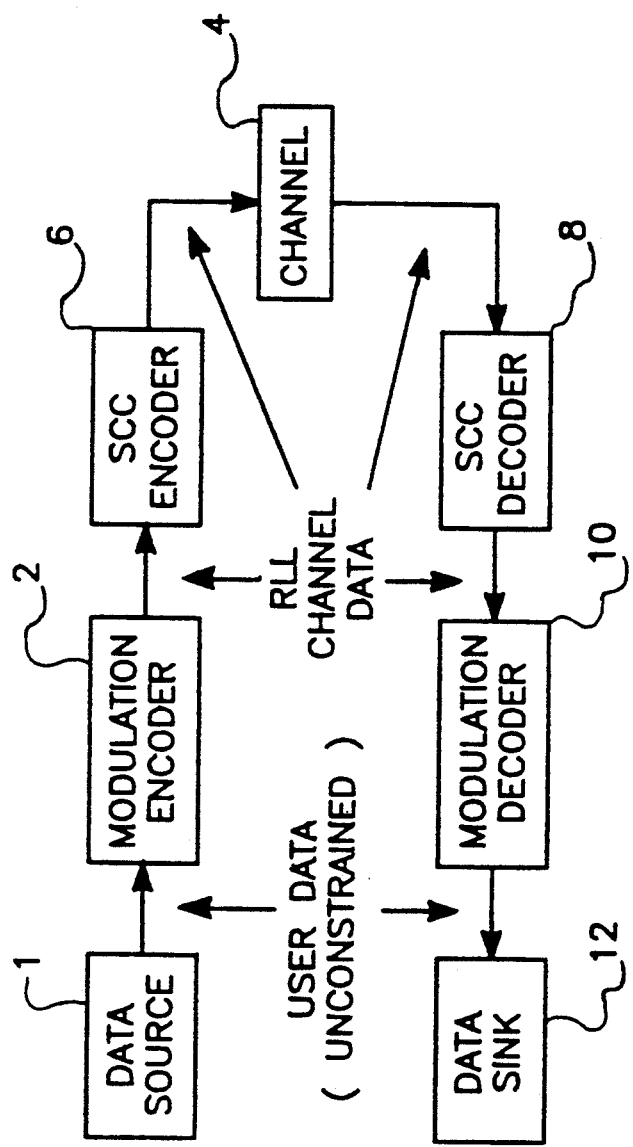
FIG. 1 is a block diagram of a system which employs shift-correction coding/decoding.

Referring to FIG. 1, data from an information source 1 is encoded by a modulation or channel encoder 2 in accordance with an RLL (d,k) code for transmission as "message" data through a channel 4 (such as an optical disk data storage system, for example). However, as described in the above-referenced parent application, shift-correction encoder 6 (also referred to herein as an error correcting modulation (ECM) encoder) sections the message data into blocks and computes a "check" block of redundant data from each "message" block and appends the check block to its corresponding message block prior to transmission through the channel 4. The data is retrieved from the channel 4 (for example, by playing back recorded data from an optical disk data storage system) by first decoding it in a shift-correction decoder 8 (also referred to herein as an (ECM) decoder). The ECM decoder 8 detects and may correct (in the case of error correction) errors in the message block of RLL encoded data and then transmits the corrected message block to a modulation or channel decoder 10. The channel decoder 10 transforms the RLL channel data into binary data and transmits the binary data to a data sink 12.

Since the ECM code's basecode is a ternary BCH code with m=3, its natural length is $N=3^m-1=26$ trits. The ternary polynomial $$p(X)=X^3-X+1 \tag{8}$$

is irreducible and primitive, hence the polynomial $$g(X)=(X-1)p(X)=X^4X^3-X^2X-1 \tag{9}$$

generates a (26,22) single-error-correcting (T=1) ternary BCH code. A tutorial example will now be given using g(X) of equation (9). To simplify our exposition we shorten this code to a (8,4) ternary BCH having T=1.

Review of Shift-Correction Encoding

Figure 2:
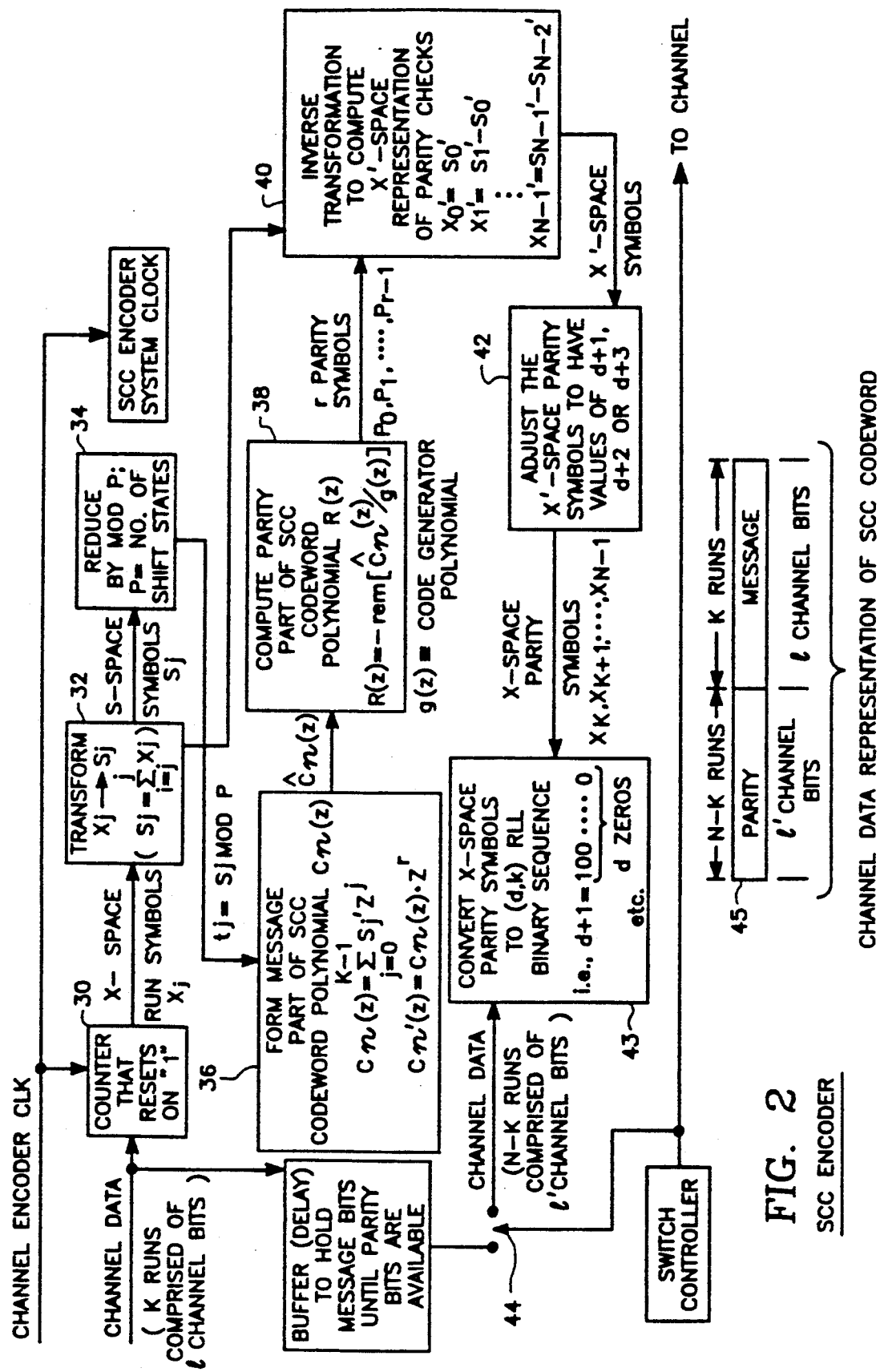
FIG. 2 is a block diagram illustrating the operation of the shift-correction code encoder of the system of FIG. 1.

Shift-correction encoding will now be briefly reviewed in connection with the present example by reference to FIG. 2 which illustrates the operation of the encoder 6 of FIG. 1. To perform shift-correction encoding, we start by taking in K information channel runs (Block 30 of FIG. 2). In our example K=4, and we will suppose that the input information runs are given by the 4-tuple $$\{X_i\}=\{X_0, X_1, X_2, X_3\}=(4,5,6,7). \tag{10}$$

Using the relation $S_i=\{X_0+X_1+\ldots+X_i\}$ we obtain the corresponding S-vector (Block 32 of FIG. 2)

$$\{S_i\}=\{S_0, S_1, S_2, S_3\}=\{4,9,15,22\} \tag{11}$$

and reducing the $S_i$ modulo 3 (Block 34 of FIG. 2), the corresponding t-vector $$\{t_i\}=\{1,0,0,1\}. \tag{12}$$

Thus, the shift-correction codeword's information-part polynomial is (Block 36 of FIG. 2)

$$d(X)=X^4+1=C_m(X), \tag{13}$$

and the four parity check trits are (Block 38 of FIG. 2) the ternary coefficients of $$r(X)=-rem\ [X^4 d(X)/g(X)]=-X^3-X^2-X+1.$$

That is, the parity vector is $$\{p_i\}=\{-1,-1,-1,+1\} \tag{14}$$

and the complete logical shift-correction codeword is $$\{C_i\}=\{t_i\}+\{p_i\}=\{1,0,0,1,-1,-1,-1,+1\}. \tag{15}$$

The entire logical codeword of equation (15) must be converted to d,k-constrained binary data before it can be transmitted through the channel. The information part $\{t_i\}$ of equation (15) already has such a representation, viz., the input channel data that corresponds to the runs $\{X_i\}$ of equation (10). The parity symbols $\{p_i\}$ given by equation (14), however, exist at this point only as logical quantities. It is the coding (and subsequent decoding) of the sequence $\{p_i\}$ to a d,k-constrained binary sequence that is the subject of the present invention.

In the method of accomplishing this latter coding described in the referenced commonly assigned application the elements $p_i$ are effectively treated as modulo 3 reductions of S-vector elements which correspond to the parity part of the shift-correction codeword. Thus, the logical S-vector that corresponds to the entire codeword is obtained by extending equation (11) to produce $$\{S'_i\}=\{4,9,15,22,-1,-1,-1,1\}. \tag{16}$$

This vector is then transformed into a corresponding channel run vector $\{X'_i\}$ (Block 40 of FIG. 2) using the inverse of the transformation used to obtain equation (11) from equation (10), i.e., using $$\begin{aligned} X'_0 &= S'_0 \\ X'_1 &= S'_1 - S'_0 \\ &\ \vdots \\ X'_i &= S'_i - S'_{i-1}. \end{aligned} \tag{17}$$

Carrying out this process we obtain {from equation (16)}

$$\{X'_i\}=\{4,5,6,7,-23,0,0,2\}. \tag{18}$$

This vector is then converted to a (d,k) constrained binary channel run vector (Block 42 of FIG. 2) by adjusting the elements of $\{X'_i\}$ by adding appropriate multiples of $d+1$ (where d is the d-constraint of the modulation code being used) to the last four elements of $\{X'_i\}$ (i.e., the elements corresponding to the parity checks) so that all the elements of the vector of equation (18) will be positive and as small as possible without violating the RLL code's d-constraint. The result of doing this is (since $d=2$)

$$\{X''_i\}=\{4,5,6,7,4,3,3,5\}, \qquad (19)$$

The final values of each of the last four elements of equation (19) will thus be either $d+1$, $d+2$, or $d+3$. These elements are then converted to a RLL binary sequence (Block 43 of FIG. 2) and combined with the message channel bits (under control of a switch 44 of FIG. 2) to form the channel data representation 45 of FIG. 2 of the entire shift-correction codeword that is transmitted through the channel.

Review of Shift-Correction Decoding

Figure 3:
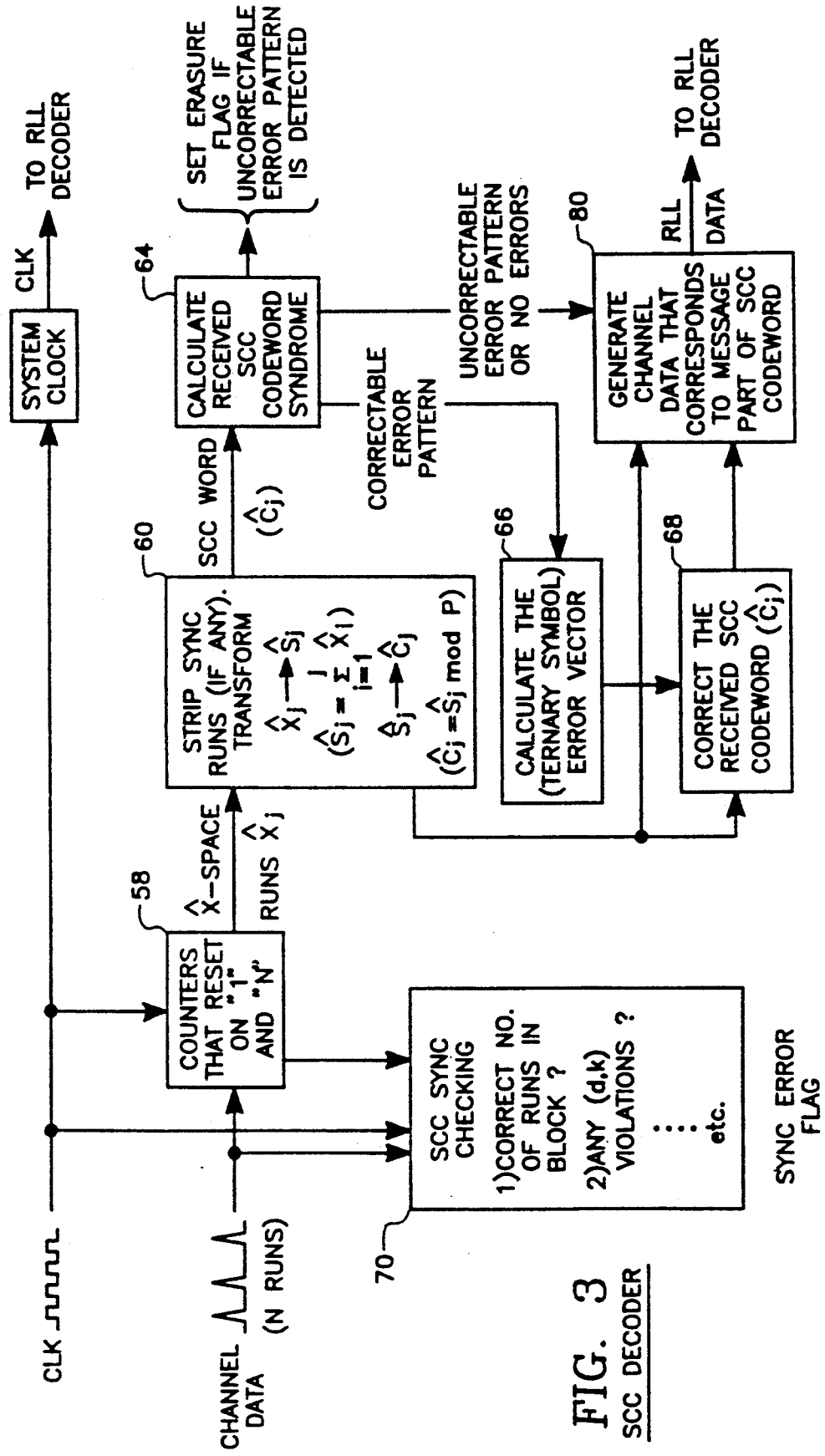
FIG. 3 is a block diagram illustrating the operation of the shift-correction code decoder of the system of FIG. 1.

Shift-correction decoding will now be reviewed in connection with the present example by reference to FIG. 3, which illustrates the operation of the decoder 8 of FIG. 1. Suppose now, that during transmission (recording and playback) a left-wise shift-error occurs at the fifth channel "one" of the codeword of equation (19). The received codeword will then be represented by the channel run sequence $$\{\hat{x}_i\}=\{4,5,6,e,\text{uns}/6/,e,\text{uns}/5/,3,3,5\}, \qquad (20)$$

(received at Block 58) where the underlined runs are the ones effected by the shift-error. Following the decoding method of the above-referenced application, we next obtain the logical ternary symbol form of the received shift-correction codeword by first calculating the received $\hat{S}$-vector $\{\hat{S}_i\}$ from equation (20) using $\hat{S}_i=\hat{X}_0+\hat{X}_1 \ldots +\hat{X}_i$ (Block 60 of FIG. 3) to obtain $$\{\hat{S}_i\}=\{4,9,15,21,26,29,32,37\} \qquad (21)$$

and then reducing each element modulo 3 to obtain the received logical codeword (also Block 60 of FIG. 3)

$$\{\hat{C}_i\}=\{1,0,0,0,-1,-1,-1,1\} \qquad (22)$$

Comparing vector (22) with the transmitted codeword vector (15) we see that these differ (under modulo 3 addition) by the error vector $$\{e_i\}=\{\hat{C}_i\}-\{C_i\}=\{0,0,0,-1,0,0,0,0\} \qquad (23)$$

which corresponds to the single error event which one unit decrement of the fourth run, or equivalently, a left-shift of the fifth channel "one". That is, once the error vector (23) is obtained (Block 66 of FIG. 3), modulo 3 subtraction of it from the received logical codeword vector (22) produces the correct codeword vector (15) (Block 68 of FIG. 3). We note that this $\{e_i\}$, which we deduced here via inspection, would in practice be computed via the algorithm used to decode the ternary (8,4) BCH codeword of equation (22) (or by table look up base on the syndrome computed in Block 64 of FIG. 3).

Once the error vector of equation (23) is obtained, error correction is accomplished by incrementing the fourth received run by one, and decrementing the fifth received run by one, i.e., by right shifting the fifth received channel "one". Finally, the message runs of the corrected codeword are transformed to binary RLL channel data and sent to the RLL decoder (Block 80 of FIG. 3).

Trit Pair to Single Runlength Coding/Decoding

We now describe the use of the trit pair to runlength coding/decoding of the present invention to code/decode the parity trits of the above example. This corresponds to the encoding operation of Blocks 40 and 42 of FIG. 2 and the treatment of parity runs by the decoding operation of Block 60 of FIG. 3. The parity check sequence $\{p_i\}$ of equation (14) is first calculated in the normal way. Next, adjacent $p_i$ elements are formed into a sequence of pairs and runlength numerals $R_j$ are assigned to them according to Table I. Thus the $\{p_i\}$ given as by equation (14) would become $$\{p_i\}=\{(-1,-1),(-1,1)\}=\{7,6\} \qquad (24)$$

where $\{7,6\}=\{R_7,R_6\}$ as shown in Table I.

The complete logical shift-correction codeword, which is analogous to equation (15), is then $$\{C_i\}=\{t_i\}+\{p_i\}=\{1,0,0,1,7,6\} \qquad (25)$$

In order to convert the codeword of equation (25) to d,k-constrained binary data, we take its last two elements (i.e., the parity symbols) to be modulo 9 reductions of the S-vector elements which correspond to the parity part of the shift-correction codeword. The S-vector that corresponds to the entire codeword of equation (25) is therefore obtained by extending equation (11) to produce $$\{S'_i\}=\{4,9,15,22,7,6\} \qquad (26)$$

and the corresponding unadjusted run vector is (using equations (17)):

$$\{X'_i\}=\{4,5,6,7,-15,-1\} \qquad (27)$$

We now adjust equation (27) by adding multiples of nine to the last two elements until we obtain the smallest positive values that obey the d,k-constraints of the RLL code (recall that we have assumed $d=2$ and $(k-d) \geq 8$). Carrying out this process yields $$\{X_i\}=\{4,5,6,7,3,8\}, \qquad (28)$$

which is the channel data run representation of the entire shift-correction codeword that is transmitted through the channel.

Suppose now, that during transmission (recording and playback) a left-wise shift-error occurs (as before) at the fifth channel "one" of the codeword of equation (28). The received codeword will then have the channel run representation $$\{\hat{x}_i\}=\{4,5,6,\underline{6},\underline{4},8\} \qquad (29)$$

where the underlined runs are those effected by the shift-error. We start to decode as taught in the above-referenced application, i.e., we construct a received S-vector in the normal way, obtaining $$\{\hat{S}_i\}=\{4,9,15,21,25,33\} \qquad (30)$$

and then reduce the information runs (the first four elements of equation (30)) modulo 3 and reduce the parity runs (the last two elements of equation (30)) modulo 9 to produce the received logical codeword $$\{\hat{C}_i\} = \{1,0,0,0,7,6,\}. \quad (31)$$

The received codeword of equation (31) differs (under modulo 3 and modulo 9 addition for the information and parity parts of the sequence respectively) from the transmitted word of equation (25) by $$\{e_i\} = \{\hat{C}_i\} - \{C_i\} = \{0,0,0,-1,0,0\} \quad (32)$$

which completely (as before) specifies the shift-error that occurred.

Although the preceding discussion illustrated the application of the trit pair to runlength coding/decoding method to a shift-error correction coding system, it did not demonstrate how the trit pair to runlength code prevents error multiplication (because the shift-error event used in our example did not alter either of the two parity checks of equation (24)). We will therefore illustrate the new system's maintenance of the shift-error condition in the following extension of our example.

Suppose the codeword of equation (25) having the channel run representation of equation (28) is transmitted and a right-shift error occurs at the sixth channel "one", so that the received channel run representation of the codeword is $$\{\hat{x}_i\} = \{4,5,6,7,\underline{4},\underline{7}\} \quad (33)$$

where the underlined runs are those affected by the shift-error. The corresponding $\{\hat{S}_i\}$ and $\{\hat{C}_i\}$ vectors are thus $$\{\hat{S}_i\} = \{4,9,15,22,26,33,\} \quad (34)$$

and $$\{\hat{C}_i\} = \{1,0,0,1,8,6\}, \quad (35)$$

where the last two elements of equation (35) are the run numerals assigned to the two pairs of parity trits. Comparison of equations (35) and (31) shows that only one of the run numerals has been altered by the shift-error, and that it has been changed by only +1. Reference to Table I shows that the received run numerals decode as $$\{8,6\} = \{(-1,0),(-1,1)\} = \{-1,0,-1,1\} \quad (36)$$

and comparison of equation (36) with equation (24) shows that only one parity trit was changed by the shift error.

Once the shift-correction codeword's parity trits are obtained from the received runlength numerals via a trit pair to runlength decoder that implements the decoding specified in Table I, the shift-correction decoder can decode the shift-correction codeword in the normal way. This completes our example illustration.

Trit Pair to Runlength Encoder/Decoder Operation

The trit pair to runlength encoder is a combinatorial logic circuit that has as its input a pair of trits (ternary digits) and has as its output the runlength number, an integer from zero to eight, defined modulo 9. Encoding of an input trit pair is done by finding that trit pair in the trit pair column of Table I; the output is the corresponding runlength numeral in the third column. Decoding is done in an analogous fashion.

Trit Pair to Runlength Encoder Circuitry

Figure 4:
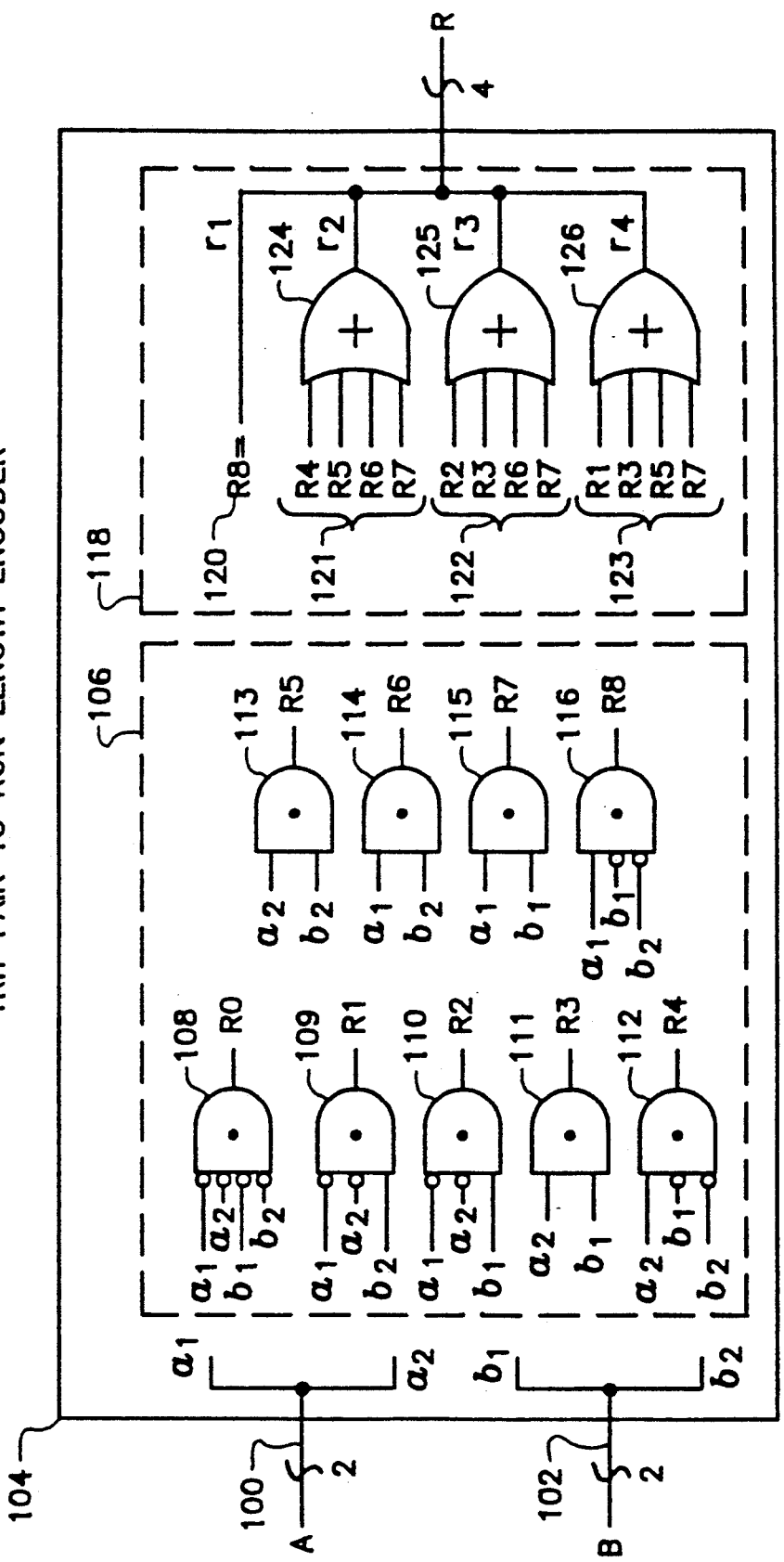
FIG. 4 is a logic circuit diagram illustrating a trit pair to runlength encoder of the present invention.

The operations depicted by Blocks 40 and 42 of FIG. 2 are performed in a first embodiment of the present invention by the trit pair encoder 104 of FIG. 4. The inputs 100, 102 to the trit pair encoder 104 of FIG. 4 comprise the trit pair AB where $A = a_1 a_2$ and $B = b_1 b_2$, i.e., the trit values 0,1, and 2 are represented by the bit pairs 00, 01, and 10 respectively. The first stage 106 of the encoder 104 has AND gates 108-116 receiving respective pairs of inputs $a_1$, $a_2$, $b_1$, $b_2$. The AND gates 108-116 of the first stage 106 implement the Boolean equations of the first column of Table II to generate outputs $R_j$ for $j=1,\ldots,8$. All $R_j$ produced by the first stage 106 are zero except the one in the same row of Table I as the corresponding values of $a_1$ $a_2$ $b_1$ $b_2$ (i.e., the $R_j$ output by 106 have binary values; one of the $R_j$ will have value one and all others have value zero).

The second stage 118 of the encoder 104 receives as its four inputs 120-123 respective combinations of the binary values of $R_j$ from the first stage 106 for $0 \le j \le 8$. The inputs are transformed by respective OR gates 124-126 to a four bit output R. The second stage 118 implements the Boolean equations of the right-hand column of Table II. Only one $R_j$ can be equal to one. For the one $R_j = 1$, the output $r_1 r_2 r_3 r_4$ occurs is the one that appears in the same row of Table I as does the non-zero $R_j$. In fact, the output $r_1 r_2 r_3 r_4$ that occurs in the binary representation of the index j of the non-zero $R_j$.

Runlength To Trit Pair Decoder Circuitry

Figure 5:
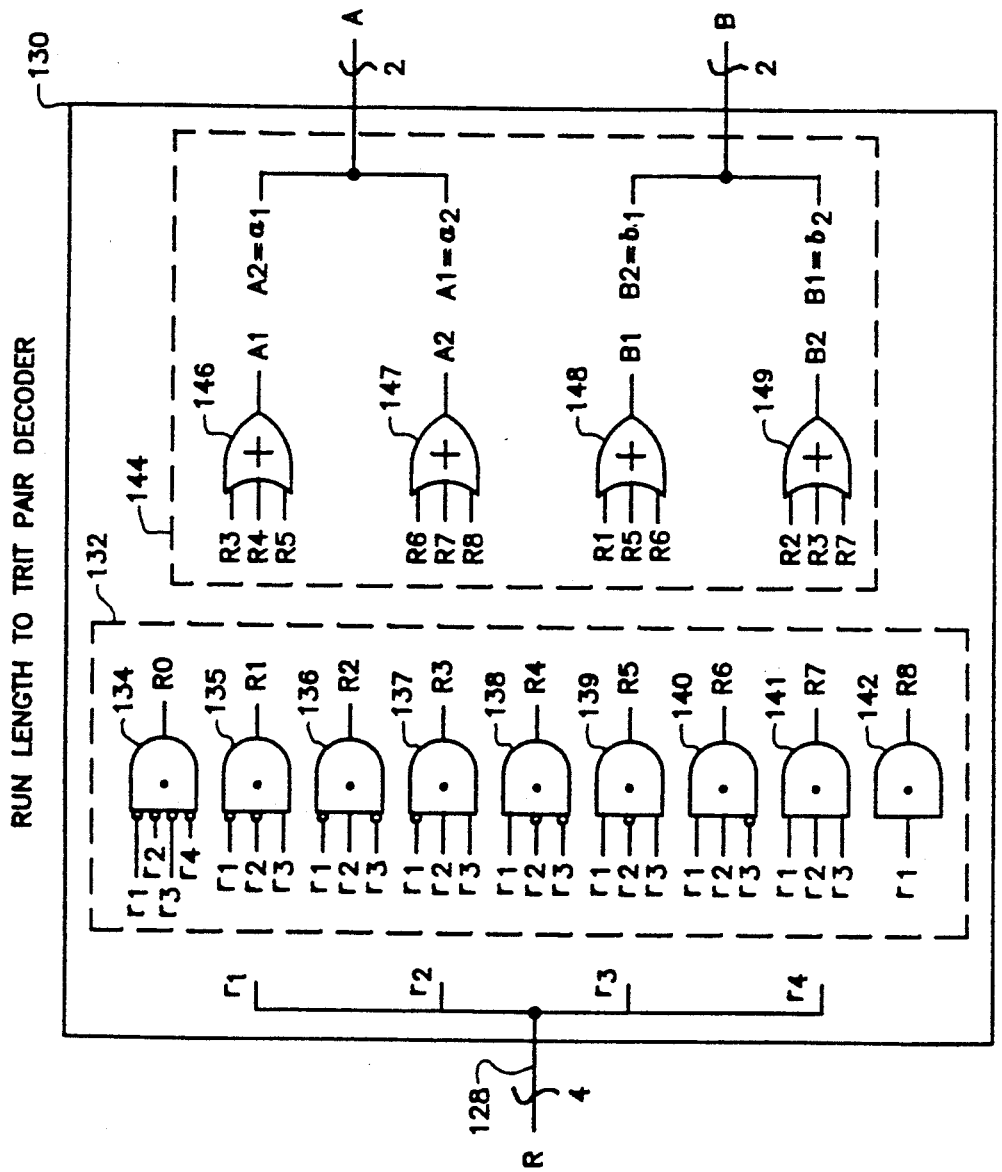
FIG. 5 is a logic circuit diagram illustrating a trit pair to runlength decoder of the present invention.

The operation depicted by Block 60 of FIG. 3 is performed in the first embodiment of the present invention by the trit pair decoder 130 of FIG. 5. The input 128 to the decoder 130 of FIG. 5 is R, the binary representation of the runlength, namely the four bits $r_1 r_2 r_3 r_4$. The first stage 132 of the decoder 130 has AND gates 134-142 generating from the four-bit input R the outputs $R_j$, where $j = 0,\ldots,8$ and only one of the $R_j$ equals one (all the other being zero), as discussed above with regard to the encoder 104. The AND gates 134-142 of the second stage 132 implement the Boolean equations in the left column of Table III. The second stage 144 of the decoder 130 has OR gates 146-149 receiving respective combinations of the $R_j$ from the first stage 132. The second stage generates therefrom the trit pair $A = a_1 a_2$ and $B = b_1 b_2$ by implementing the Boolean equations in the right column of Table III. As before, only one of the $R_j$ equals one. Again, the rule is that $R_j$ equals 1 if and only if the current values of $a_1$ $a_2$ $b_1$ $b_2$ and j appear on the same row of Table I.

Trit Triple To Runlength Pair Coding/Decoding

The trit triple to runlength pair encoder is a combinatorial logic circuit that has as its input a triple of trits (ternary digits) having values either 0,1 or 2 and has as its output a pair of numbers, the runlength numerals. The runlength numerals are integers from zero to five, defined modulo six.

Encoding is done according to the trit triple to run pair encoding/decoding table (Table IV). Each of the 27 possible trit triples appears exactly once in Table IV, as a triple not contained in a smaller box. (The nine triples in the smaller boxes of Table IV are used for decoding).

Encoding is done by locating the input trit triples (ignoring those lying in the smaller boxes) in Table IV;

the first output run numeral is the one associated with the row in which the input trit triple is located, and the second output run numeral is associated with the corresponding column.

Decoding is done in a similar fashion. A pair of received runs determines uniquely a row and column in Table IV and this row and column determines a trit triple.

The encoding/decoding table (Table IV) has the following important property, which we call "the shift-error property": Triples of trits in adjacent locations of Table IV differ in exactly one element.

Trit Triple To Run Length Pair Encoder Circuitry

Figure 6:
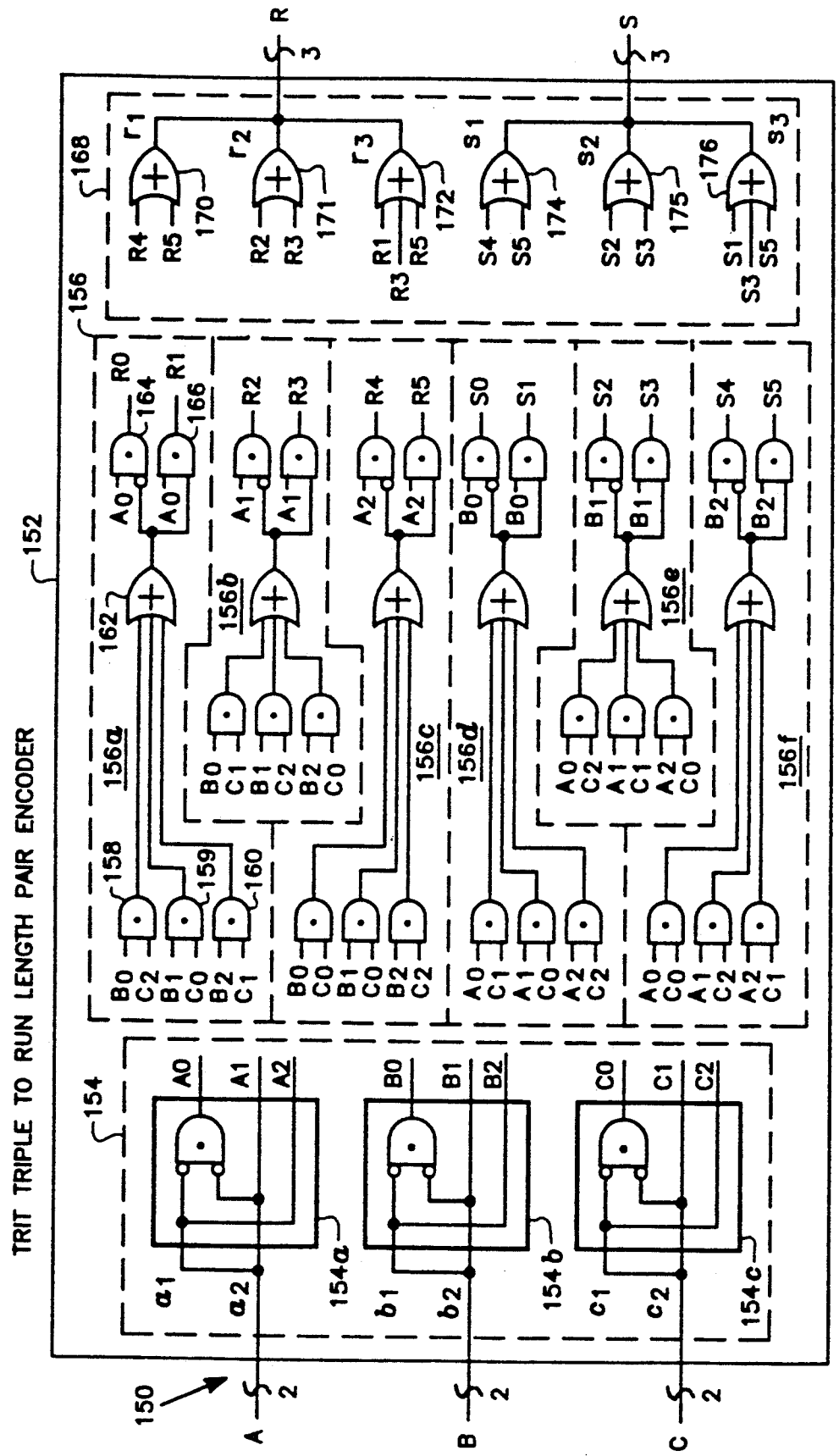
FIG. 6 is a logic circuit diagram illustrating a trit-triple to runlength pair encoder of the present invention.

In a second embodiment of the present invention, the encoding operations of Blocks 40 and 42 of FIG. 2 are performed by the trit triple encoder of FIG. 6. The input 150 to the encoder 152 of FIG. 6 is the trit triple ABC where $A = a_1 a_2$, $B = b_1 b_2$ and $C = c_1 c_2$, i.e., the individual trits of value 0, 1, or 2 are represented by the bit pairs 00, 01, and 10 respectively.

The first stage 154 of the encoder 152 has three logic elements 154a, 154b, 154c which convert the input bit pairs of the three trits A, B, C to nine outputs $X_i$ where $i = 0$, 1, or 2 and X is one of A, B, or C. The logic element 154a implements the Boolean equations in the left column of the first three rows of Table V. The logic element 154b implements the Boolean equations in the middle column of the first three rows of Table V. The logic element 154c implements the Boolean equations in the right column of the first three rows of Table V. Exactly three of the $X_i$ have value one (all the others being zero) and these three $X_i$ correspond to the input triple ABC. For example, if the triple trit 012 is the received input, the three non-zero $X_i$ are $A_0$, $B_1$ and $C_2$.

The second stage 156 of the encoder 152 has inputs $X_i$, where X is one of A, B, or C and $i = 0$, 1, or 2, and outputs $Y_j$ where Y is one of R or S and $j = 0, \ldots, 5$. In accordance with Table IV, the output $R_j$ equals one if and only if the input trit triple ABC lies in an unboxed location of the $j^{th}$ row of Table IV and the output $S_j$ equals one if and only if the input trit triple ABC lies in an unboxed location in the $j^{th}$ column of Table IV.

Logic elements 156a–156f implement the Boolean equations in the fourth through ninth rows of Table V to generate the outputs $Y_j$. The logic element 156a is typical and has three AND gates 158–160 each receiving a certain pair of the inputs $X_i$ as indicated in the drawing of FIG. 6. An OR gate 162 receives the outputs of the three AND gates 158–160. Two AND gates 164, 166 each receives the output of the OR gate 162 and certain one of the inputs $X_i$, as indicated in the drawing of FIG. 6. The outputs of the two AND gates 164, 166 are two of the outputs $Y_j$.

The third stage 168 of the encoder 152 has as inputs $R_0, \ldots R_5, S_0, \ldots, S_5$ and outputs the pair of binary triples $R = r_1 r_2 r_3$ and $S = s_1 s_2 s_3$. Only one $R_0, \ldots R_5$ can equal one, all the others being zero. And, $r_1 r_2 r_3$ is the binary representation of the index j of the non-zero $R_j$. Similarly, exactly one of $S_0, \ldots S_5$ equals one and $s_1 s_2 s_3$ is the binary representation of the index j of the non-zero $S_j$.

The third stage 168 has a first set of three OR gates 170–172 each receiving a certain combination of the inputs $R_0, \ldots R_5$ and whose outputs are the three bits of the output R defined in Table V. The OR gates 170–172 implement the Boolean equations in left column of the bottom three rows of Table V. The third stage also has a second set of three OR gates 174–176 each receiving a certain combination of the inputs $S_0, \ldots S_5$ and whose outputs are the three bits of the output S defined in Table V. The OR gates 174–176 implement the Boolean equations in the right column of the bottom three rows of Table V.

We note that this encoder will never output run numeral pairs that correspond to the rows and columns of the trit triples contained in the small boxes in Table IV (such trit triples are always encoded as the pair of run numerals corresponding to the next smaller row and column, i.e., they will be represented by a shorter length channel bit sequence.)

Runlength Pair To Trit Triple Decoder Circuitry

Figure 7:
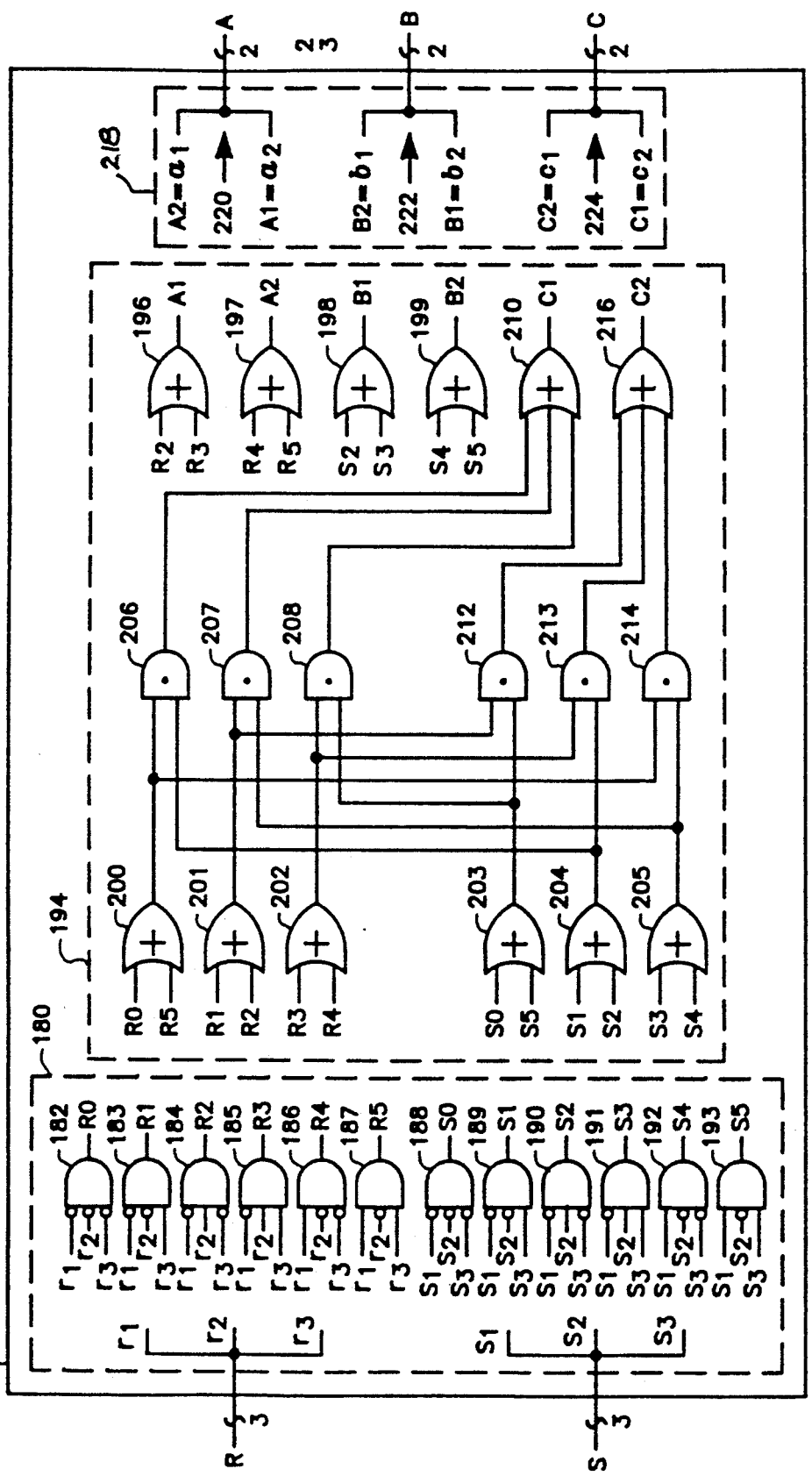
FIG. 7 is a logic diagram illustrating a trit-triple to runlength pair decoder of the present invention.

In the second embodiment of the invention, the decoding operation of Block 60 of FIG. 3 is performed by the trit triple decoder 178 of FIG. 7. The input to the decoder 178 of FIG. 7 is the run numeral pair RS, where $R = r_1 r_2 r_3$ and $S = s_1 s_2 s_3$ each have one of the values 0, 1, ..., 5 represented by the bit triples 000, 001, 010, 011, 100, and 101 respectively.

The first stage 180 of the decoder 178 has twelve outputs $X_i$ where $i = 0, 1, 2, 3, 4$ or 5 and X is one of R or S. Exactly two of these $X_i$ will have value one and the rest zero. $X_i$ equals one if only if one of the decoder's input binary triples $r_1 r_2 r_3$ or $s_1 s_2 s_3$ is the binary representation of i, for $i = 0, \ldots, 5$.

The first stage has a first set of six AND gates 182–187 whose inputs are the $r_1 r_2 r_3$, different ones of which are inverted at the inputs of different ones of the AND gates 182–187 as indicated in the drawing of FIG. 7. The AND gates 182–187 implement the equations in the left column of the first six rows of Table VI to generate the $R_0, \ldots, R_5$. The first stage also has a second set of six AND gates 188–193 whose inputs are the $s_1 s_2 s_3$, different ones of which are inverted at the inputs of different ones of the AND gates 188–193 as indicated in the drawing of FIG. 7. The AND gates 188–193 implement the equations in the right column of the first six rows of Table VI to generate the $S_0, \ldots, S_5$.

The second stage 194 of the decoder 178 has inputs $X_i$ where X equals R or S and $i = 0, \ldots, 5$ and outputs $Y_j$ where Y is one of A, B, or C and $j = 1$ or 2. The second stage 194 has OR gates 196–199 each receiving a different pair of the inputs $X_i$ as indicated in the drawings and implement the Boolean equations in the seventh and eighth rows of Table VI. The remaining pairs of the inputs $X_i$ are received by different ones of OR gates 200–205 in the second stage 194. A set of three AND gates 206–208 receiving different combinations of the outputs of the OR gates 200–205 together with an OR gate 210 implement the Boolean equation of the ninth row of Table VI. A set of three AND gates 212–214 receiving different combinations of the outputs of the OR gates 200–205 together With an OR gate 216 implement the Boolean equation of the tenth row of Table VI.

The third stage 218 is simply a set of wired OR gates 220, 222, 224 which implement the simple Boolean equations of the bottom two rows of Table VI. The third stage 218 has as inputs $A_1$, $A_2$, $B_1$, $B_2$, $C_1$, $C_2$, and outputs the triple of binary pairs $(a_1, a_2)$, $(b_1, b_2)$, $(c_1, c_2)$ which are the binary representations of the (decoded) trit triple ABC.

Finally, we note that if one of the two received run numerals that are input to the FIG. 4 decoder is incorrect by one decimal unit, the decoder will output a trit triple that has only one of its three elements incorrect, even if one of the illegal run pairs (i.e., one of the run pairs not used by the encoder) is received (since such illegal run pairs correspond to the Table IV rows and columns containing the small boxes, and the decoder decodes such illegal run pairs to the trit triple values contained in the respective box).

TABLE III-continued
BOOLEAN ALGEBRA EQUATIONS RUNLENGTH TO TRIT PAIR DECODER

$R_8 = r_1$

TABLE IV
TRIT TRIPLE - RUN LENGTH PAIR ENCODING/DECODING TABLE

| FIRST RUN NUMERAL $R_j$ | SECOND RUN NUMERAL, $S_k$ | | | | | |
|---|---|---|---|---|---|---|
|  | $S_0 = 0$ | $S_1 = 1$ | $S_2 = 2$ | $S_3 = 3$ | $S_4 = 4$ | $S_5 = 5$ |
| $R_0 = 0$ | 0 0 0 | 0 0 1 | 0 1 1 | 0 1 2 | 0 2 2 | 0 2 0 |
| $R_1 = 1$ | 0 0 2 | [0 0 0] | 0 1 0 | [0 1 1] | 0 2 1 | [0 2 2] |
| $R_2 = 2$ | 1 0 2 | 1 0 0 | 1 1 0 | 1 1 1 | 1 2 1 | 1 2 2 |
| $R_3 = 3$ | 1 0 1 | [1 0 2] | 1 1 2 | [1 1 0] | 1 2 0 | [1 2 1] |
| $R_4 = 4$ | 2 0 1 | 2 0 2 | 2 1 2 | 2 1 0 | 2 2 0 | 2 2 1 |
| $R_5 = 5$ | 2 0 0 | [2 0 1] | 2 1 1 | [2 1 2] | 2 2 2 | [2 2 0] |

TABLE I
TRIT PAIR TO RUNLENGTH CODING/DECODING TABLE

| TRIT PAIR | | BINARY REPRESENTATION OF A B | | RUNLENGTH NUMERAL | BINARY REPRESENTATION of $R_j$ |
|---|---|---|---|---|---|
| A | B | $a_1a_2$ | $b_1b_2$ | $R_j$ | $r_1r_2r_3r_4$ |
| 0 | 0 | 00 | 00 | $R_0 = 0$ | 0 0 0 0 |
| 0 | 1 | 00 | 01 | $R_1 = 1$ | 0 0 0 1 |
| 0 | 2 | 00 | 10 | $R_2 = 2$ | 0 0 1 0 |
| 1 | 2 | 01 | 10 | $R_3 = 3$ | 0 0 1 1 |
| 1 | 0 | 01 | 00 | $R_4 = 4$ | 0 1 0 0 |
| 1 | 1 | 01 | 01 | $R_5 = 5$ | 0 1 0 1 |
| 2 | 1 | 10 | 01 | $R_6 = 6$ | 0 1 1 0 |
| 2 | 2 | 10 | 10 | $R_7 = 7$ | 0 1 1 1 |
| 2 | 0 | 10 | 00 | $R_8 = 8$ | 1 0 0 0 |

TABLE II
BOOLEAN ALGEBRA EQUATIONS FOR TRIT PAIR TO RUNLENGTH ENCODER

| | |
|---|---|
| $R_0 = \bar{a}_1\bar{a}_2\bar{b}_1\bar{b}_2$ | $r_1 = R_8$ |
| $R_1 = \bar{a}_1\bar{a}_2b_2$ | $r_2 = R_4 + R_5 + R_6 + R_7$ |
| $R_2 = \bar{a}_1\bar{a}_2b_1$ | $r_3 = R_2 + R_3 + R_6 + R_7$ |
| $R_3 = a_2b_1$ | $r_4 = R_1 + R_3 + R_5 + R_7$ |
| $R_4 = a_2\bar{b}_1\bar{b}_2$ | |
| $R_5 = a_2b_2$ | |
| $R_6 = a_1b_2$ | |
| $R_7 = a_1b_1$ | |
| $R_8 = a_1\bar{b}_1\bar{b}_2$ | |

TABLE III
BOOLEAN ALGEBRA EQUATIONS RUNLENGTH TO TRIT PAIR DECODER

| | |
|---|---|
| $R_0 = \bar{r}_1\bar{r}_2\bar{r}_3\bar{r}_4$ | $A_1 = R_3 + R_4 + R_5$ |
| $R_1 = \bar{r}_2\bar{r}_3r_4$ | $A_2 = R_6 + R_7 + R_8$ |
| $R_2 = \bar{r}_2r_3\bar{r}_4$ | $B_1 = R_1 + R_5 + R_6$ |
| $R_3 = \bar{r}_2r_3r_4$ | $B_2 = R_2 + R_3 + R_7$ |
| $R_4 = r_2\bar{r}_3\bar{r}_4$ | |
| $R_5 = r_2\bar{r}_3r_4$ | $a_1 = A_2 \quad b_1 = B_2$ |
| $R_6 = r_2r_3\bar{r}_4$ | $a_2 = A_1 \quad b_2 = B_1$ |
| $R_7 = r_2r_3r_4$ | |

TABLE V
BOOLEAN ALGEBRA TRIT TRIPLE TO RUNLENGTH PAIR ENCODER

| | | |
|---|---|---|
| $A_0 = \bar{a}_1\bar{a}_2$ | $B_0 = \bar{b}_1\bar{b}_2$ | $C_0 = \bar{c}_1\bar{c}_2$ |
| $A_1 = a_2$ | $B_1 = b_2$ | $C_1 = c_2$ |
| $A_2 = a_1$ | $B_2 = b_1$ | $C_2 = c_1$ |

$R_0 = \overline{A_0 \cdot (B_0C_2 + B_1C_0 + B_2C_1)}$  $S_0 = \overline{B_0 \cdot (A_0C_1 + A_1C_0 + A_2C_2)}$
$R_1 = A_0 \cdot (B_0C_2 + B_1C_0 + B_2C_1)$  $S_1 = B_0 \cdot (A_0C_1 + A_1C_0 + A_2C_2)$
$R_2 = \overline{A_1 \cdot (B_0C_1 + B_1C_2 + B_2C_0)}$  $S_2 = \overline{B_1 \cdot (A_0C_2 + A_1C_1 + A_2C_0)}$
$R_3 = A_1 \cdot (B_0C_1 + B_1C_2 + B_2C_0)$  $S_3 = B_1 \cdot (A_0C_2 + A_1C_1 + A_2C_0)$
$R_4 = \overline{A_2 \cdot (B_0C_0 + B_1C_1 + B_2C_2)}$  $S_4 = \overline{B_2 \cdot (A_0C_0 + A_1C_2 + A_2C_1)}$
$R_5 = A_2 \cdot (B_0C_0 + B_1C_1 + B_2C_2)$  $S_5 = B_2 \cdot (A_0C_0 + A_1C_2 + A_2C_1)$ $r_1 = R_4 + R_5$  $s_1 = S_4 + S_5$
$r_2 = R_2 + R_3$  $s_2 = S_2 + S_3$
$r_3 = R_1 + R_3 + R_5$  $s_3 = S_1 + S_3 + S_5$

TABLE VI
BOOLEAN ALGEBRA RUNLENGTH PAIR TO TRIT TRIPLE DECODER

| | |
|---|---|
| $R_0 = \bar{r}_1\bar{r}_2\bar{r}_3$ | $S_0 = \bar{s}_1\bar{s}_2\bar{s}_3$ |
| $R_1 = \bar{r}_1\bar{r}_2r_3$ | $S_1 = \bar{s}_1\bar{s}_2s_3$ |
| $R_2 = \bar{r}_1r_2\bar{r}_3$ | $S_2 = \bar{s}_1s_2\bar{s}_3$ |
| $R_3 = \bar{r}_1r_2r_3$ | $S_3 = \bar{s}_1s_2s_3$ |
| $R_4 = r_1\bar{r}_2\bar{r}_3$ | $S_4 = s_1\bar{s}_2\bar{s}_3$ |
| $R_5 = r_1\bar{r}_2r_3$ | $S_5 = s_1\bar{s}_2s_3$ |
| $A_1 = R_2 + R_3$ | $B_1 = S_2 + S_3$ |
| $A_2 = R_4 + R_5$ | $B_2 = S_4 + S_5$ |

$C_1 = (R_0 + R_5)(S_1 + S_2) + (R_1 + R_2)(S_3 + S_4) + (R_3 + R_4)(S_0 + S_5)$
$C_2 = (R_1 + R_2)(S_0 + S_5) + (R_3 + R_4)(S_1 + S_2) + (R_0 + R_5)(S_3 + S_4)$

| $a_1 = A_2$ | $b_1 = B_2$ | $c_1 = C_2$ |
|---|---|---|
| $a_2 = A_1$ | $b_2 = B_1$ | $c_2 = C_1$ |

While the invention has been described in detail by specific reference to preferred embodiments thereof, it is understood that variations and modifications thereof may be made without departing from the true spirit and scope of the invention.

What is claimed is:

1. A method of processing channel encoded data encoded by a channel code, said channel encoded data being transmitted and received on a channel, said method comprising:

encoding said channel encoded data prior to its being transmitted on said channel in accordance with a first code in an algebraic coding field, whereby successive runs of channel bits in said channel encoded data are transformed to corresponding message elements of said algebraic coding field from which redundant check elements of said field are computed in accordance with said first code, said message elements and said check elements comprising a codeword of said first code;

wherein said encoding step comprises:

transforming groups of p of said redundant check elements of said field to groups of q runs of said channel code wherein p and q are non-zero integers at least as great as unity and p is greater than g, wherein said transforming step includes the step of mapping each group of p elements of said field to a unique one of a set of allowable runs of said channel code, and transmitting said check symbols with said message symbols in said channel, whereby to minimize the number of channel code runs and also channel bits representing said check elements of said field.

2. The method of claim 1 further comprising:

decoding a version of said codeword received from said channel in accordance with said first code;

wherein said decoding step comprises:

inverse-transforming said groups of q runs that represent parity information to corresponding groups of p check elements of said field;

converting runs that represent message information to corresponding message elements of said field, whereby said message and check elements comprise the codeword received form said channel; and detecting errors in said received codeword.

3. The method of claim 1 wherein said channel code comprises a runlength limited binary code with constraints (d,k) and said algebraic coding field comprises a Galois field $GF(y^m)$, wherein y is a prime number and m is a positive integer.

4. The method of claim 3 wherein said transforming step comprises mapping pairs of said elements of said field to solitary runs whereby $p=2$ and $q=1$, and wherein said constraints (d,k) are such that $k-d>7$, whereby said channel code contains enough runs to uniquely specify each pair of said elements of said field.

5. The method of claim 3 wherein said transforming step comprises mapping triples of said elements of said field to pairs of said runs whereby $p=3$ and $q=2$, and said constraints (d,k) are such that $k-d>4$ whereby said channel code contains enough runs to allow pairs of runs to uniquely specify each triple of said elements of said field.

6. A method of processing channel encoded data encoded by a channel code, said channel encoded data being transmitted and received on a channel, said method comprising:

encoding said channel encoded data prior to its being transmitted on said channel in accordance with a first code in an algebraic coding field, whereby successive runs of channel bits in said channel encoded data are transformed to corresponding message elements of said algebraic coding field from which redundant check elements of said field are computed in accordance with said first code, said message elements and said check elements comprising a codeword of said first code;

wherein said encoding step comprises:

transforming groups of p of said redundant check elements of said field to groups of q runs of said channel code wherein p and q are non-zero integers at least as great as unity and p is greater than q, and transmitting said check symbols with said message symbols in said channel, whereby to minimize the number of channel code runs and also channel bits representing said check elements of said field;

decoding a version of said codeword received from said channel in accordance with said first code;

wherein said decoding step comprises:

inverse-transforming said groups of q runs that represent parity information to corresponding groups of p check elements of said field, wherein said inverse-transforming step includes the step of mapping each group of q runs to a unique p element sequence of elements of said field;

converting runs that represent message information to corresponding message elements of said field, whereby said message and check elements comprise the codeword received from said channel; and detecting errors in said received codeword.

7. The method of claim 6 wherein said channel code comprises a run length limited binary code with constraints (d,k) and said algebraic coding field comprises a Galois field $GF(y^m)$ where $y=3$ and $m=1$, whereby said elements of said field are trits having three possible values.

8. The method of claim 7 wherein said inverse-transforming step comprises mapping solitary runs to pairs of said elements whereby $p=2$ and $q=1$, and wherein said constraints (d,k) are such that $k-d>7$, whereby said channel code contains enough runs to uniquely specify each pair of said elements of said field.

9. The method of claim 7 wherein said inverse-transforming step comprises mapping pairs of said runs to triples of said elements of said field whereby $p=3$ and $q=2$, and wherein said constraints (d,k) are such that $k-d>4$, whereby said channel code contains enough runs to allow pairs of them to uniquely specify each triple of said elements of said field.

10. A system for processing channel encoded data encoded by a channel code said channel encoded data being transmitted and received on a channel, said system comprising:

means for encoding said channel encoded data prior to its being transmitted on said channel in accordance with a first code in an algebraic coding field, whereby successive runs of said channel encoded data are transformed to corresponding message elements of said algebraic coding field from which redundant check elements of said field are computed in accordance with said first code, said message elements and said check elements comprising a codeword of said first code;

wherein said means for encoding comprise:

means for transforming groups of p of said redundant check elements of said field to groups of q check runs of said channel code wherein p and q are non-zero integers at least as great as unity and p is greater than q, wherein said means for transforming include means for mapping each group of p elements of said field to a unique one of a set of allowable runs of said channel code, and means for transmitting said check symbols with said message symbols in said channel, whereby the number of channel code data representing said check elements of said field is minimized.

11. The system of claim 10 further comprising:

means for decoding a version of said codeword received from said channel in accordance with said first code;

wherein said means for decoding comprise:

means for inverse-transforming said groups of q runs that represent parity information to corresponding groups of p check elements of the said field;

means for converting runs that represent message information to corresponding message elements of said field, whereby said message and check elements comprise the codeword received from said channel; and means for detecting errors in said received codeword.

12. The system of claim 10 wherein said channel code comprises a run length limited binary code with constraints (d,k) and said algebraic coding field comprises a Galois field $GF(y^m)$, wherein y is a prime number and m is an integer.

13. The system of claim 12 wherein said means for transforming comprise means for mapping pairs of said elements to solitary runs whereby p=2 and q=1, and wherein said constraints (d,k) are such that k−d>7, whereby said channel code contains enough runs to uniquely specify each pair of said elements of said field.

14. The system of claim 12 wherein said means for transforming comprise means for mapping triples of said elements of said field to pairs of said runs whereby p=3 and q=2, and wherein said constraints (d,k) are such that k=d>4 whereby said channel code contains enough runs to allow pairs of runs to uniquely specify each triple of said elements of said field.

15. A system for processing channel encoded data encoded by a channel code, said channel encoded data being transmitted and received on a channel, said system comprising:

means for encoding said channel encoded data prior to its being transmitted on said channel in accordance with a first code in an algebraic coding field, whereby successive runs of channel encoded data are transformed to corresponding message elements of said algebraic coding field from which redundant check elements of said field are computed in accordance with said first code, said message elements and said check elements comprising a codeword of said first code;

wherein said means for encoding comprise:

means for transforming groups of p of said redundant check elements of said field to groups of q check runs of said channel code wherein p and q are non-zero integers at least as great as unity and p is greater than q, and means for transmitting said check symbols with said message symbols in said channel, whereby to minimize the number of channel code data representing said check elements of said field, means for decoding a version of said codeword received form said channel in accordance with said first code;

wherein said means for decoding comprise:

means for inverse-transforming said groups of groups of p check elements of the said field, wherein said means for inverse-transforming include means for mapping each group of q runs to a unique p element-long sequence of elements of said field;

means for converting runs that represent message information to corresponding message elements of said field, whereby said message and check elements comprise the codeword received from said channel; and means for detecting errors in said received codeword.

16. The system of claim 15 wherein said channel code comprises a run length limited binary code with constraints (d,k) and said algebraic coding field comprises a Galois field $GF(y^m)$ where y=3 and m=1, whereby said elements of said field are trits having three possible values.

17. The system of claim 16 wherein said means for inverse-transforming comprise means for mapping solitary runs to pairs of said elements whereby p=2 and q=1, and wherein said constraints (d,k) are such that k−d>7, whereby said channel code contains enough runs to uniquely specify each pair of said elements of said field.

18. The system of claim 16 wherein said means for inverse-transforming comprise means for mapping pairs of said runs to triples of said elements of said field whereby p=3 and q=2, and wherein said constraints (d,k) are such that k−d>4, whereby said channel code contains enough runs to enable pairs of them to uniquely specify each triple of said elements of said field.

* * * * *

UNITED STATES PATENT AND TRADEMARK OFFICE
CERTIFICATE OF CORRECTION

PATENT NO. : 5,257,270
DATED : October 26, 1993
INVENTOR(S) : Hugh M. Hilden, et al It is certified that error appears in the above-indentified patent and that said Letters Patent is hereby corrected as shown below:

Column 18, line 20

Insert --q runs that represent parity information to corresponding-- after the word"of".

Signed and Sealed this

Nineteenth Day of April, 1994

BRUCE LEHMAN

*Attest:*

*Attesting Officer*    *Commissioner of Patents and Trademarks*